United States Patent
Udayakumar et al.

(10) Patent No.: US 6,802,987 B1
(45) Date of Patent: Oct. 12, 2004

(54) INTEGRATED CIRCUIT FERROELECTRIC INFRARED DETECTOR AND METHOD

(75) Inventors: K R Udayakumar, Dallas, TX (US); Howard R. Beratan, Richardson, TX (US); Charles M. Hanson, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 494 days.

(21) Appl. No.: 09/422,380

(22) Filed: Oct. 21, 1999

Related U.S. Application Data

(60) Provisional application No. 60/105,249, filed on Oct. 22, 1998.

(51) Int. Cl.$^7$ .................. C04B 35/465; C04B 35/47
(52) U.S. Cl. .................. 252/62.9 R; 501/136
(58) Field of Search ............... 252/62.9 R; 501/136

(56) References Cited

U.S. PATENT DOCUMENTS 3,481,875 A * 12/1969 Akashi et al. .......... 252/62.9 R

FOREIGN PATENT DOCUMENTS

| JP | 4-160035 | * | 6/1992 |
| JP | 5-17151  | * | 1/1993 |

OTHER PUBLICATIONS

Translation of JP 4–160035.*

* cited by examiner

Primary Examiner—C. Melissa Koslow
(74) Attorney, Agent, or Firm—Carlton H. Hoel; W. James Brady; Frederick J. Telecky, Jr.

(57) ABSTRACT

Ferroelectric materials useful in monolithic uncooled infrared imaging use Ca and Sn substitutions in PbTiO3 and also have alternatives with dopants such as Dy, Ho, Bi, Ce, and Fe. The ferroelectrics may also be used in non-volatile integrated circuit memories.

5 Claims, 4 Drawing Sheets

INTEGRATED CIRCUIT FERROELECTRIC INFRARED DETECTOR AND METHOD

CROSS-REFERENCE OF THE RELATED APPLICATIONS

This application claims the benefit of Provisional Application No. 60/105,249 filed Oct. 22, 1998.

GOVERNMENT RIGHTS

The government may have rights in this application pursuant to contract no. DML01-96-C-0076.

BACKGROUND OF THE INVENTION

The invention relates to electronic semiconductor devices, and, more particularly, to ferroelectric structures and fabrication methods for such structures.

Ferroelectric materials have applications both as capacitor dielectrics for integrated circuit memories (both non-volatile and dynamic RAM) and as uncooled infrared imagers (focal plane arrays, night vision). Thin film ceramic ferroelectrics have the greatest utility, and various compounds have been investigated, such as barium strontium titanate (BST), lead zirconate titanate (PZT), and strontium bismuth tantalate (SBT).

For non-volatile memory applications the ferroelectric should have resistance to fatigue due to polarization switching, and a large remnant polarization helps. For dynamic memory applications the ferroelectric (typically operated as a paraelectric) should have low leakage current and a large dielectric constant. For uncooled infrared imaging applications the ferroelectric should have a large pyroelectric coefficient and low dissipation loss and low dielectric constant.

FIGS. 1a–1c illustrate schematically a small array of cells/pixels of a dynamic RAM, a non-volatile RAM, and a uncooled infrared focal plane. In a DRAM the ferroelectric appears as a common capacitor dielectric (along with a common ½ Vdd electrode) for all capacitors of the array with the capacitors buried below metal interconnects. In a non-volatile RAM the ferroelectric only appears in the capacitors, and each row of cells has a common drive line; again the capacitors are buried below metal interconnects. In contrast, the ferroelectric uncooled focal plane capacitors abut infrared absorbers (or are themselves the absorbers) which are exposed to incoming (through an optical system) infrared radiation, and the capacitors are thermally isolated from the underlying read-out integrated circuit.

The current ferroelectric materials have problems of difficult manufacture and limited performance.

SUMMARY OF THE INVENTION

The present invention provides ferroelectric materials derived from lead titanate with substitution for lead by calcium and substitution for titanium by tin together with optional dopant additions. Preferred embodiments use metal organic decomposition (MOD) to form thin film of these ferroelectrics at low temperatures which permit use as part of integrated circuit uncooled imagers and memories.

BRIEF DESCRIPTION OF THE DRAWINGS

The drawings are heuristic for clarity.

DESCRIPTION OF THE PREFERRED EMBODIMENTS

Overview

The preferred embodiment ferroelectric materials include substituted lead titanate ($PbTiO_3$) and in particular include calcium substitution for lead and tin substitution for titanium (both substitutions in the range of up to about 30 mol % but with the sum up to about 40 mol %). Other preferred embodiments include additions of various dopants (up to about 1%) such as Mn, Dy, Bi, Y, Ho, Ce, Gd, Ga, Cd, and Fe in the calcium and tin substituted $PbTiO_3$.

The preferred embodiment materials may be used in preferred embodiment thermally isolated pixels of a monolithic uncooled infrared imager (focal plane array); the imager has an array of ferroelectric capacitors suspended over the read out integrated circuit.

Uncooled Infrared Imager

Figure 1A:
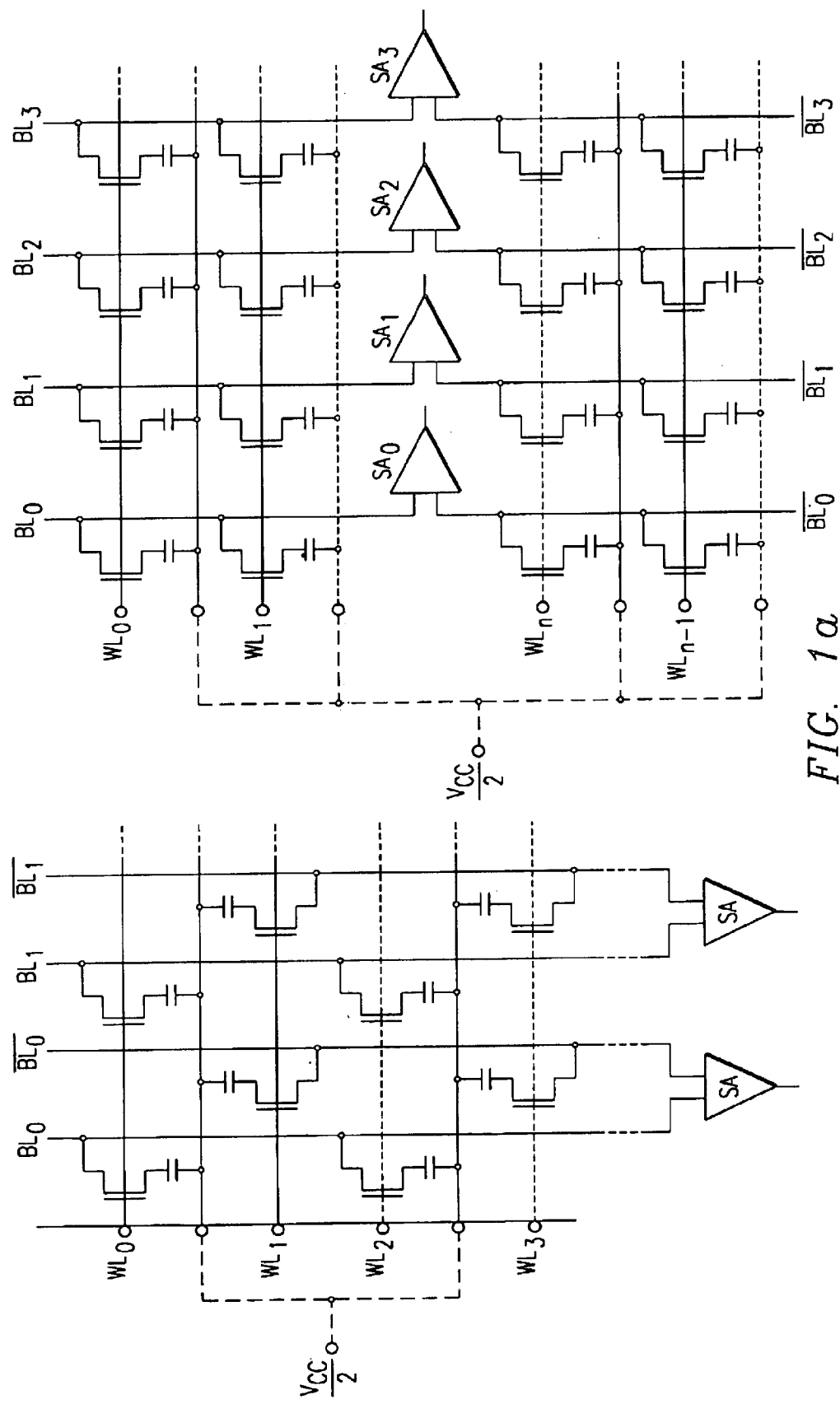
FIGS. 1 a–c are schematic views of capacitor arrays.
Figure 1B:
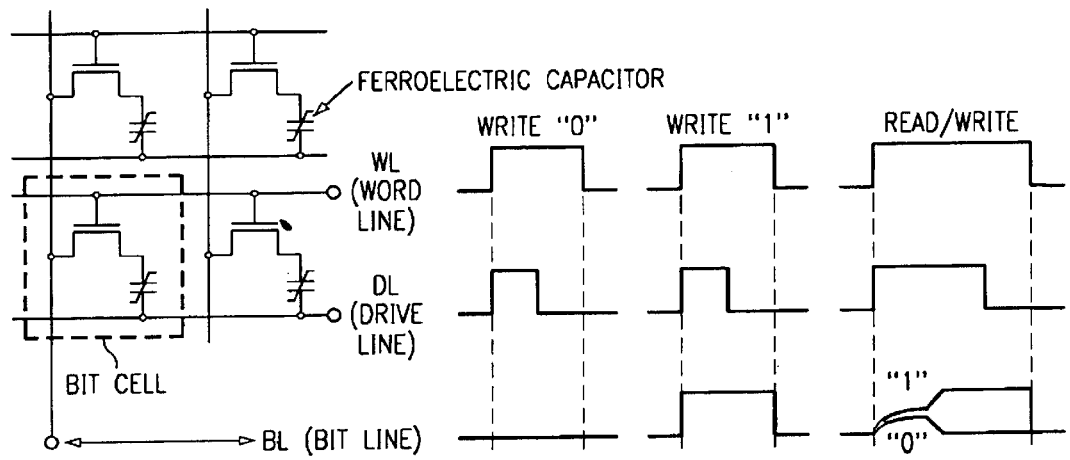
Figure 1C:
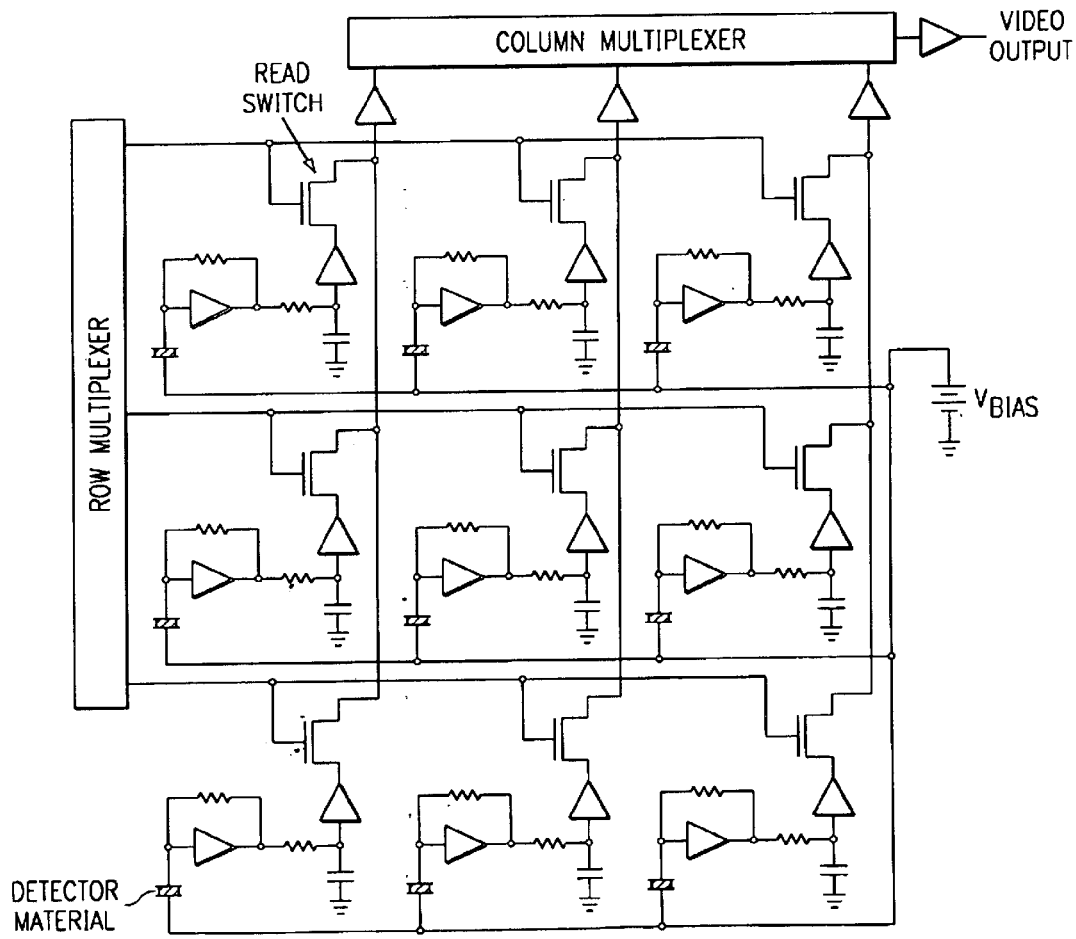
Figure 2A:
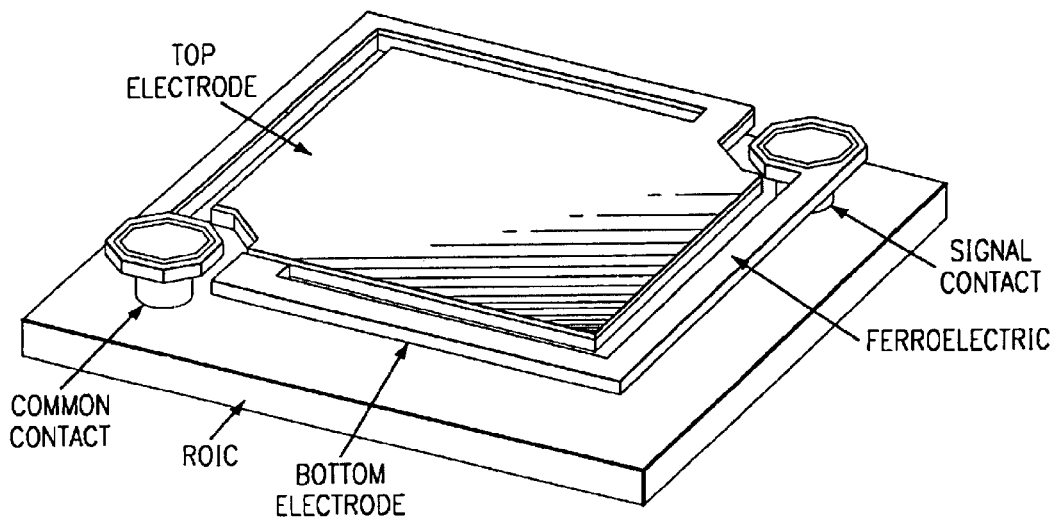
FIG. 2 illustrates a preferred embodiment thermally isolated pixel.
Figure 2B:
Figure 2B:
Figure 3:
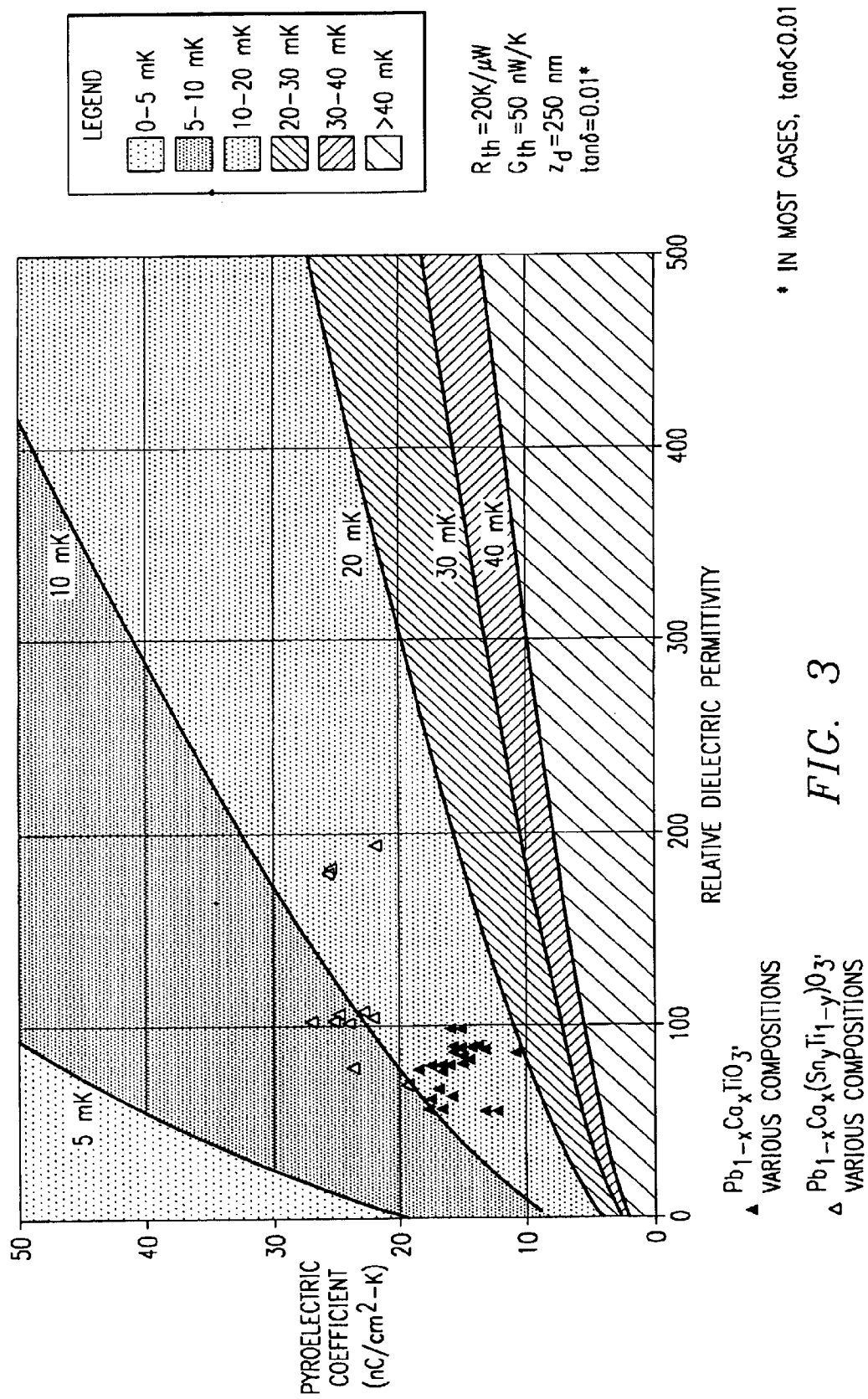
FIG. 3 shows estimated NETDs.

FIG. 2 illustrates a single pixel of a preferred embodiment uncooled ferroelectric imager with the ferroelectric capacitor suspended over the read out integrated circuit to provide thermal isolation. Incident infrared radiation is imaged onto an array of such pixels, and the radiation is chopped to increase signal-to-noise ratios. The radiation heats (or lack of radiation cools) the pixel, and the read out integrated circuit measures the change in polarization with temperature (pyroelectric coefficient). In particular, the noise equivalent temperature difference (NETD) of objects in the field of view that can be detected can be estimated as a function of the pyroelectric coefficient and dielectric constant as shown in FIG. 3. FIG. 3 presumes dielectric dissipation loss dominates the noise and assumes pixels on 48.5 µm centers with 65% fill factor, 80% infrared absorption, and $20 \times 10^6$ K/W thermal isolation.

Preferred embodiment ferroelectric materials for use in such uncooled imagers include calcium and tin substituted lead titanate and doped versions of these materials. A preferred embodiment method of imager fabrication with a metal organic decomposition (MOD) spin on process for the ferroelectric proceeds as follows.

First, fabricate the underlying read out integrated circuit using polysilicon gate MOSFETs (CMOS) on silicon wafers and TiN clad tungsten metallization (to withstand the high firing temperatures of the ceramic ferroelectrics).

Next, spin on a sacrificial layer (such as polyimide) which will permit the suspension of the pixels over the substrate and thereby form an optical cavity; so set the thickness of the polyimide to about one quarter wavelength of the desired center band of absorption. Then deposit bottom electrode material, such as platinum or platinum on titanium or a semi-transparent conducting oxide such as lanthanum strontium cobalt oxide, and photolithographically pattern and etch to form the bottom capacitor electrodes. The bottom electrodes may be thin, so an overetch will not remove excessive amounts of polyimide.

Form a ferroelectric layer on the bottom capacitor electrodes and sacrificial layer by MOD: spin on a solution of lead acetate and titanium lactate, plus calcium nitrate, tin acetate, and dopant oxides (as needed) dissolved in an aqueous acetic acid solution. Pyrolyze at 400–500° C. to drive the reaction and eliminate the organics; this yields an amorphous layer. The amorphous layer may conveniently be roughly 100 nm thick or less depending upon molarity of the solution, so repeated cycles of spin on and pyrolysis may be used to build up layers of 200–400 nm thickness.

Next, pattern and etch to form pixel support bridges and vias. Then pattern and etch to expand the vias and expose bottom electrodes.

Rapid thermal anneal at 500–600° C. to crystallize (perovskite lattice) the ferroelectric; the rapid thermal anneal must be short enough to avoid damaging the read out integrated circuit. For example, 500° C for 180 seconds or 600° C. for 10 seconds.

Deposit top electrode and infrared absorber. Pattern and etch to form top electrode. Pattern and etch vias; and deposit post metal. Pattern and etch posts; and strip polyimide sacrificial layer with an oxygen plasma.

If a memory were being fabricated, thermal isolation would not be needed and the polyimide omitted, and an overlying dielectric and interconnects would be formed on top. Further, if a DRAM were being fabricated, then the ferroelectric and top electrode need only be removed outside of the memory cell array because the top electrode and ferroelectric (operated in the paraelectric region) would be common to all capacitors in a block.

The following sections describe material preferred embodiments.

Calcium and Tin Substituted Preferred Embodiments

In $PbTiO_3$, calcium substitutes on the Pb lattice sites and tin substitutes on the Ti lattice sites to form $(Pb,Ca)(Ti,Sn)O_3$. These substitutions modify the pyroelectric coefficient, dielectric dissipation (loss tangent), and dielectric constant (relative permittivity) of the ferroelectric to yield materials with improved properties for uncooled imaging and non-volatile memory applications. In particular, these compounds with roughly 10–20 mol % Ca and 10–20 mol % Sn but constrained to a sum of the mol %s of 20–30 have permittivities of roughly 80–100, dissipation losses of roughly 0.005–0.012, and pyroelectric coefficients of roughly 16–25 $nC/cm^2$-K, depending upon the substrate and the annealing conditions (rapid thermal or furnace). Presuming pixels on 48.5 um centers with 65% fill factor, 80% infrared absorption, and $20 \times 10^6$ K/W thermal isolation, these ferroelectric materials yield imagers with estimated NETD (noise equivalent temperature difference) of roughly 9–12 mK. FIG. 3 illustrates constant NETD lines plus experimental results.

Experimental pyroelectric coefficient (nC/cm 2-K), dielectric dissipation (loss tangent), and dielectric constant (relative permittivity) for various calcium and tin substitutions and anneal conditions are as follows:

| Compound | Anneal conditions | Pyroelectric | Dissipation | Dielectric | NETD |
|---|---|---|---|---|---|
| pure $PbTiO_5$ | 500° C., 180 sec | 10.5 | 0.005 | 71 | 17.6 |
| | 550° C., 10 sec | 9.9–15.6 | 0.004–0.005 | 64–69 | 11.9–17.3 |
| | 600° C., 10 sec | 5.9–9.5 | 0.01–0.018 | 70–78 | 25.5–42.4 |
| | 700° C., 10 sec | 10.4 | 0.005 | 72 | 17.8 |
| 10% Ca | 475° C., 180 sec | 18.4 | 0.01 | 78 | 12.2 |
| | 500° C., 30–180 sec | 9.1–15.1 | 0.005–0.01 | 56–89 | 14.1–21.5 |
| | 550° C., 10–120 sec | 9–14.9 | 0.005–0.011 | 83–90 | 14.7–17.1 |
| | 575° C., 30 sec | 10.7–15.7 | 0.004–0.02 | 82–106 | 15.1–23.3 |
| | 600° C., 10 sec | 11.5–14.6 | 0.005–0.014 | 87–114 | 15.4–23.2 |
| | 650° C., 30 sec | 10.5–15.8 | 0.008 | 64–87 | 13.2–20.8 |
| | 700° C., 10 sec | 12.3–19.6 | 0.005–0.011 | 56–111 | 11.3–19.5 |
| | 750° C., 10 sec | 16.5 | 0.019 | 77 | 17.1 |
| | 500° C., 60 min | 12.6 | 0.006 | 103 | 17.5 |
| | 600° C., 30–60 min | 19.1–20.1 | 0.009–0.01 | 96–112 | 11.9–13.7 |
| | 700° C., 30–60 min | 18.6–22.4 | 0.019–0.015 | 109–144 | 12.7–15.6 |
| 20% Ca | 500° C., 180 sec | 17.6 | 0.013 | 57 | 12.1 |
| | 575° C., 30 sec | 16.6 | 0.013 | 57 | 12.9 |
| | 600° C., 10 sec | 17.4 | 0.017 | 62 | 13.7 |
| 30% Ca | 500° C., 180 sec | 15.0 | 0.026 | 81 | 20.3 |
| | 575° C., 30 sec | 16.0 | 0.026 | 80 | 19.0 |
| | 600° C., 10 sec | 16.6 | 0.026 | 80 | 18.3 |
| 5% Sn | 500° C., 30–180 sec | 2.5–11.1 | 0.01 | 93–106 | 21.4–99 |
| | 600° C., 10 sec | 13.6 | 0.007 | 84 | 15.5 |
| | 700° C., 10 sec | 18.1 | 0.01 | 112 | 14.4 |
| 10% Sn | 500° C., 180 sec | 16.0 | 0.009 | 99 | 15.1 |
| | 575° C., 30 sec | 15.7 | 0.009 | 87 | 14.5 |
| | 600° C., 10 sec | 15.4 | 0.01 | 99 | 16.0 |
| 20% Sn | 500° C., 30–180 sec | 2.0–4.5 | 0.009–0.012 | 48–50 | 40.3–96 |
| | 600° C., 10 sec | 3.2 | 0.015 | 111 | 90 |
| | 700° C., 10 sec | 26.6 | 0.014 | 133 | 11.8 |
| 30% Sn | 500° C., 30 sec | 4.2 | 0.006 | 32 | 35.3 |
| | 600° C., 10 sec | 3.0 | 0.007 | 35 | 51.7 |
| | 700° C., 10 sec | 24.8 | 0.016 | 110 | 12.1 |
| 10% Ca, 10% Sn | 500° C., 180 sec | 16.8 | 0.009 | 68 | 12.4 |
| | 575° C., 30 sec | 16.0–19.2 | 0.009 | 45–70 | 11.0–11.3 |
| | 600° C., 10 sec | 23.5–25.4 | 0.012–0.015 | 79–97 | 10.2–11.0 |
| | 700° C., 10 sec | 17.4 | 0.009 | 80 | 12.7 |
| 20% Ca, 10% Sn | 500° C., 180 sec | 23.8 | 0.007 | 102 | 9.8 |
| | 575° C., 30 sec | 24.9 | 0.008 | 103 | 9.7 |
| | 600° C., 10 sec | 26.7 | 0.009 | 103 | 9.4 |
| | 700° C., 10 sec | 24.6 | 0.007 | 107 | 9.7 |
| 10% Ca, 20% Sn | 500° C., 180 sec | 21.8 | 0.005 | 108 | 10.1 |
| | 575° C., 30 sec | 21.8 | 0.006 | 105 | 10.4 |
| | 600° C., 10 sec | 22.6 | 0.006 | 104 | 10.2 |
| 20% Ca, 20% Sn | 500° C., 180 sec | 25.2 | 0.015 | 182 | 17.3 |
| | 575° C., 30 sec | 21.6 | 0.014 | 195 | 14.7 |
| | 600° C., 10 sec | 25.4 | 0.012 | 180 | 13.5 |

Figure 4:
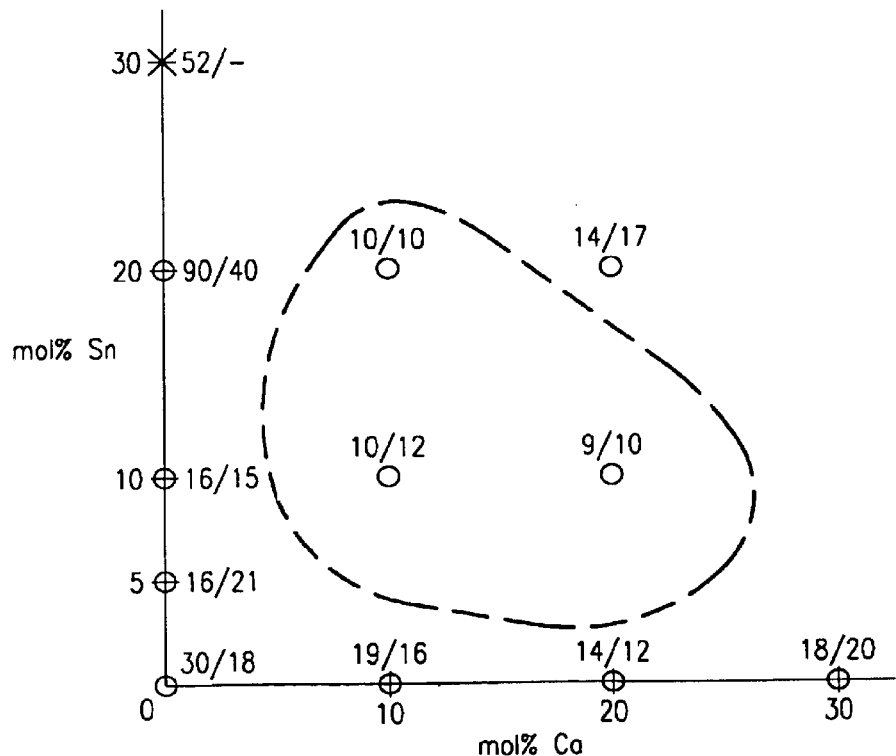
FIG. 4 illustrates preferred embodiment material compositions.

The Ca plus Sn substitutions yield high pyroelectric coefficients with low temperature anneals, and only the 20 mol % Ca plus 20 mol % Sn has a relatively high dielectric constant. Because the monolithic imager has a low thermal budget once the read out integrated circuit has been fabricated (e.g., a thermal budget of less than about 600° C. for 20 seconds, 575° C. for 45 seconds, 550° C. for 90 seconds, or 525° C. for 200 seconds), consider only the foregoing compounds with anneals at 500° C. for 180 seconds or less and at 600° C. for 10 seconds. These give estimated NETDs of roughly 9–10 mK for the 20 mol % Ca and 10 mol % Sn substitution; 10 mK for the 10 mol % Ca and 20 mol % Sn substitution; and 11–12 mK for the 10 mol % Ca and 10 mol % Sn substitution. FIG. 4 is a scatter diagram of the calcium and tin substitutions and corresponding estimated NETDs for anneals of 600° C., 10 seconds and 500° C., 180 seconds. The dashed line defines a region of compounds with good estimated NETDs; the center of the regions appears to be roughly 15 mol % Ca and 13 mol % Sn.

An alternative description of compositions with apparently good NETDs is $(Pb_{1-x}Ca_x)(Ti_{1-y}Sn_y)O_3$ with $0.15<+y<0.4$ and $0.1<y/x<4$. This describes a quadralateral roughly circumscribing the dashed line region of FIG. 4.

Doped Calcium and Tin Substituted Preferred Embodiments

The foregoing calcium and tin substituted $PbTiO_3$ preferred embodiments can be modified with additions of small amounts (5 mol % or less) of dopants such as Mn, Dy, Bi, Y, Ho, Ce, Gd, Ga, Cd, and Fe.

Experimental pyroelectric coefficient (nC/cm2-K), dielectric dissipation (loss tangent), dielectric constant (relative permittivity), and estimated NETD for these dopants added to 10 mol % calcium substituted $PbTiO_3$ (e.g., $Pb_{0.9}Ca_{0.1}TiO_3$) for roughly 350 nm thick films are as follows:

| Dopant | Anneal conditions | Pyroelectric | Dissipation | Dielectric | NETD |
|---|---|---|---|---|---|
| 0.2% Mn | 500° C., 180 sec | 16.3 | 0.012 | 87 | 15.0 |
| 1% Mn | 500° C., 180 sec | 18.0 | 0.008 | 100 | 13.1 |
|  | 575° C., 30 sec | 18.7 | 0.009 | 109 | 13.4 |
|  | 600° C., 10 sec | 18.5 | 0.007 | 101 | 12.4 |
| 5% Mn | 500° C., 180 sec | 16.0 | 0.055 | 142 | 33.6 |
| 0.2% Dy | 500° C., 180 sec | 23.1 | 0.012 | 96 | 11.2 |
| 0.5% Dy | 500° C., 180 sec | 21.5 | 0.008 | 92 | 10.7 |
| 1% Dy | 500° C., 180 sec | 15.3–21.1 | 0.008–0.009 | 66 | 9.9–13.0 |
|  | 575° C., 30 sec | 19.4 | 0.01 | 66 | 11.0 |
|  | 600° C., 10 sec | 20.3 | 0.009 | 61 | 9.9 |
| (0% Ca,1% Dy) | 500° C., 180 sec | 19.2 | 0.01 | 83 | 12.0 |
| 0.5% Bi | 500° C., 180 sec | 27.4 | 0.014 | 92 | 9.8 |
| 1% Bi | 500° C., 180 sec | 16.3 | 0.007 | 102 | 14.0 |
| 0.2% Y | 650° C., 30 sec | 15–19.5 | 0.006–0.016 | 75–80 | 10.6–16.7 |
| 1% Y | 650° C., 30 sec | 13.1 | 0.015 | 71 | 18.3 |
| 0.2% Ho | 500° C., 180 sec | 20.6 | 0.01 | 79 | 11.0 |
| 1% Ho | 500° C., 180 sec | 19.1 | 0.007 | 72 | 10.6 |
| 0.2% Ce | 500° C., 180 sec | 15.6 | 0.009 | 74 | 13.7 |
| 1% Ce | 500° C., 180 sec | 17.7 | 0.007 | 77 | 11.6 |
| 0.2% Gd | 500° C., 30 sec | 17.2 | 0.007 | 82 | 12.2 |
|  | 500° C., 180 sec | 12.3 | 0.004 | 79 | 15.1 |
| 1% Gd | 500° C., 30 sec | 15.6 | 0.006 | 66 | 12.0 |
|  | 500° C., 180 sec | 12.4 | 0.007 | 78 | 16.5 |
| 0.2% Ga | 500° C., 30 sec | 14.8 | 0.008 | 63 | 31.2 |
|  | 500° C., 180 sec | 11.3 | 0.009 | 69 | 18.2 |
| 1% Ga | 500° C., 30 sec | 17.9 | 0.009 | 67 | 11.6 |
|  | 500° C., 180 sec | 13.1 | 0.008 | 74 | 15.8 |
| 0.2% Cd | 500° C., 30 sec | 14.1 | 0.006 | 71 | 13.6 |
|  | 500° C., 180 sec | 11.7 | 0.006 | 73 | 16.5 |
| 1% Cd | 500° C., 30 sec | 16.2 | 0.007 | 64 | 11.8 |
|  | 500° C., 180 sec | 14.3 | 0.008 | 70 | 14.2 |
| 0.2% Fe | 500° C., 30 sec | 15.5 | 0.007 | 69 | 12.7 |
|  | 500° C., 180 sec | 15.5 | 0.005 | 63 | 11.6 |
| 1% Fe | 500° C., 30 sec | 16.4 | 0.007 | 77 | 12.5 |
|  | 500° C., 180 sec | 15.3 | 0.006 | 76 | 12.9 |

Looking at the 500° C. for 180 seconds rapid thermal anneal results, the estimated NETDs appear most robust for Dy, Ho, Fe, Ce, and Bi dopants with NETD averages of roughly 11–13 mK. In contrast, the Ga, Cd, Gd, and Mn dopants have averages of roughly 14–17 mK.

Barium Substituted Preferred Embodiments

The barium preferred embodiments substitute Ba for 10–50 mol % of the Pb in $PbTiO_3$ That is, $Pb_{1-x}Ba_xTiO_3$ with $0.1<x<0.5$. These compounds have relative permittivities of 50–190, dissipation losses of 0.0072–0.02, and pyroelectric coefficients of 8.5–19.5 $nC/cm^2$-K, depending upon the substrate and the rapid thermal annealing conditions. These compounds would provide infrared detection performance for pixels on 48.5 um centers with 65% fill factor and $20 \times 10^6$ K/W thermal isolation of NETD of about 15–27 mK.

Resulting pyroelectric coefficient ($nC/cm^2$- K), dissipation loss tangent, and dielectric constant for various substitutions and anneal conditions are as follows:

| Compound | Anneal | Pyroelectric | Dissipation | Dielectric | NETD |
|---|---|---|---|---|---|
| 10% Ba | 600° C., 10 sec | 19.5 | 0.016 | 140 | 14.8 |
| 10% Ba | 600° C., 120 sec | 17.4 | 0.014 | 130 | 15.2 |
| 20% Ba | 575° C., 30 sec | 8.9 | 0.015 | 120 | 16.3 |
| 20% Ba | 600° C., 10 sec | 8.3–14.5 | 0.0083–0.017 | 80–110 | 15.2–25 |
| 20% Ba | 650° C., 30 sec | 15.4–18.6 | 0.013–0.02 | 50–170 | 18.0–18.6 |
| 20% Ba | 700° C., 10 sec | 13.5 | 0.014 | 130 | 19.6 |
| 20% Ba | 600° C., 10 sec + 700° C., 30 sec | 12.2 | 0.0072 | 90 | 14.6–16.7 |
| 50% Ba | 600° C., 10 sec | 9 | 0.014 | 140 | 31.0 |
| 50% Ba | 600° C., 30 sec | 9.2 | 0.014 | 170 | 33.4 |
| 50% Ba | 650° C., 30 sec | 8.5 | 0.014 | 170 | 35.9 |
| 50% Ba | 700° C., 10 sec | 8.6 | 0.016 | 190 | 39.5 |

The barium substituted lead titanates have good (rectangular) hystersis curves and a high ratio of remnant polarization to saturated polarization, and thus will make good capacitors for ferroelectric RAMs.

Modifications

The preferred embodiments can be modified in various ways while retaining the features of low temperature fabrication yielding high pyroelectric coefficients or low estimated NETDs. For example, the compositions could be varied as indicated by FIG. 4.

What is claimed is:

1. A ferroelectric material, comprising:

(a) A material composition of substituted $PbTiO_3$ with Ca substituted for Pb and Sn substituted for Ti as shown within the dashed-line region of FIG. 4.

2. The material of claim 1, further comprising:

(a) a dopant of 5 mol % or less and selected from the group consisting of Mn, Dy, Bi, Y, Ho, Ce, Gd, Ga, Cd, Fe, and mixtures thereof.

3. A ferroelectric material, comprising:

(a) $(Pb_{1-X}Ca_X)(Ti_{1-Y}Sn_Y)O_3$ with $0.15<x+y<0.4$ and $0.1<y/x<4$.

4. The material of claim 3, further comprising:

(a) a dopant of 5 mol % or less and selected from the group consisting of Mn, Dy, Bi, Y, Ho, Ce, Gd, Ga, Cd, Fe, and mixtures thereof.

5. A ferroelectric material, comprising:

(a) a material of $(Pb_{1-X}Ca_X)TiO_3$ with x in the range of about 0 to 0.1; and (b) a dopant of 1% or less and selected from the group consisting of Dy, Ho, Bi, Ce, Fe, and mixtures thereof.

\* \* \* \* \*